(12) United States Patent
Chen et al.

(10) Patent No.: US 9,887,321 B2
(45) Date of Patent: Feb. 6, 2018

(54) SEMICONDUCTOR LIGHT-EMITTING DEVICE

(71) Applicant: EPISTAR CORPORATION, Hsinchu (TW)

(72) Inventors: Yi-Ming Chen, Hsinchu (TW); Tsung-Hsien Yang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 88 days.

(21) Appl. No.: 14/546,571

(22) Filed: Nov. 18, 2014

(65) Prior Publication Data

US 2015/0137169 A1 May 21, 2015

(30) Foreign Application Priority Data

Nov. 18, 2013 (TW) .............................. 102141996 A

(51) Int. Cl.
- *H01L 33/38* (2010.01)
- *H01L 33/20* (2010.01)
- *H01L 33/62* (2010.01)
- *H01L 33/42* (2010.01)
- *H01L 33/32* (2010.01)
- *H01L 33/40* (2010.01)
- *H01L 33/48* (2010.01)

(52) U.S. Cl.
CPC .............. *H01L 33/38* (2013.01); *H01L 33/20* (2013.01); *H01L 33/382* (2013.01); *H01L 33/62* (2013.01); *H01L 33/32* (2013.01); *H01L 33/40* (2013.01); *H01L 33/42* (2013.01); *H01L 33/486* (2013.01); *H01L 2224/48091* (2013.01); *H01L 2224/73265* (2013.01)

(58) Field of Classification Search
CPC ................................ H01L 33/38; H01L 33/42
See application file for complete search history.

(56) References Cited

U.S. PATENT DOCUMENTS

| | | | | |
|---|---|---|---|---|
| 2006/0284195 A1* | 12/2006 | Nagai | ....................... | F21K 9/00 |
| | | | | 257/98 |
| 2012/0032218 A1* | 2/2012 | Choi | ....................... | H01L 33/08 |
| | | | | 257/98 |
| 2012/0074441 A1* | 3/2012 | Seo | ....................... | H01L 27/153 |
| | | | | 257/91 |

* cited by examiner

*Primary Examiner* — Fernando L Toledo
*Assistant Examiner* — Lawrence-Linh T Nguyen
(74) *Attorney, Agent, or Firm* — Muncy, Geissler, Olds & Lowe, P.C.

(57) ABSTRACT

A semiconductor light-emitting device comprises a semiconductor stack having a first surface, wherein the first surface comprises multiple protrusion portions and multiple concave portions; a first electrode on the first surface and electrically connecting with the semiconductor stack; a second electrode on the first surface and electrically connecting with the semiconductor stack; and a transparent conduction layer conformally covering the first surface and between the first electrode and the semiconductor stack, wherein the first electrode comprises a first bonding portion and a first extending portion, and the first extending portion is between the first bonding portion and the transparent conduction layer and conformally covers the transparent conduction layer.

20 Claims, 7 Drawing Sheets

SEMICONDUCTOR LIGHT-EMITTING DEVICE

TECHNICAL FIELD

The application is related to a structure of a semiconductor light-emitting device.

RELATED APPLICATION DATA

This application claims the right of priority of TW Application No. 102141996, filed on Nov. 18, 2013, and the content of which is hereby incorporated by reference in its entirety.

DESCRIPTION OF BACKGROUND ART

Light-emitting diode (LED) has been applied to the optical display device, traffic signs, data storage device, communication device, lighting device and medical equipment. As FIG. 5 shows, LED comprises an n-type semiconductor layer 1104, an active layer 1106, and a p-type semiconductor layer 1108 sequentially formed on a substrate 1102, and a portion of the p-type semiconductor layer 1108 and the active layer 1106 is removed to expose a portion of the n-type semiconductor layer 1104. A p-type electrode a1 and an n-type electrode a2 are respectively formed on the p-type semiconductor layer 1108 and the n-type semiconductor layer 1104. The n-type electrode a2 needs sufficient area for subsequent processes, such as wiring, so a considerable portion of the active layer 1106 is removed, which leads to the drop of the light-emitting efficiency.

Besides, the above-mentioned LED can be further connected to other device to form a light-emitting apparatus. FIG. 6 shows a structure of a conventional light-emitting apparatus. As FIG. 6 shows, a light-emitting apparatus comprises a sub-mount 1202 having one circuit 1204; one solder 1206 on the sub-mount 1202 for fixing a LED 1210 on the sub-mount 1202 and forming an electrical connection between the substrate 1212 of the LED 1210 and the circuit 1204 of the sub-mount 1202; and an electrical connecting structure 1208 for electrically connecting the electrode 1214 of the LED 1210 and the circuit 1204 of the sub-mount 1202, wherein the above-mentioned sub-mount 1202 can be lead frame or large size mounting substrate for designing the circuit of the light-emitting apparatus and improving heat dissipation efficiency.

SUMMARY OF THE DISCLOSURE

A semiconductor light-emitting device comprises a semiconductor stack having a first surface, wherein the first surface comprises multiple protrusion portions and multiple concave portions; a first electrode on the first surface and electrically connecting with the semiconductor stack; a second electrode on the first surface and electrically connecting with the semiconductor stack; and a transparent conduction layer conformally covering the first surface and between the first electrode and the semiconductor stack, wherein the first electrode comprises a first bonding portion and a first extending portion, and the first extending portion is between the first bonding portion and the transparent conduction layer and conformally covers the transparent conduction layer.

DETAILED DESCRIPTION OF PREFERRED EMBODIMENTS

First Embodiment

Figure 1A:
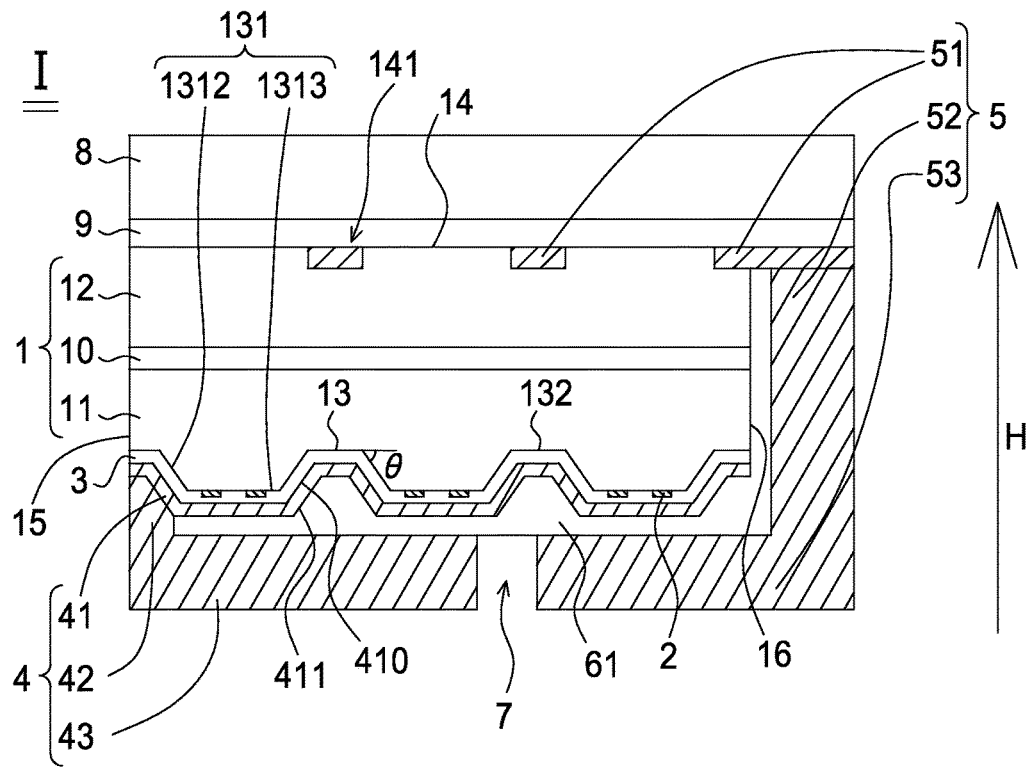
FIG. 1A shows a structure of a semiconductor light-emitting device I in accordance with the first embodiment of the application.

FIG. 1A shows a structure of a semiconductor light-emitting device I in accordance with the first embodiment of the application. The semiconductor light-emitting device disclosed by the embodiment is a flip-chip type of light-emitting diode device with a concave reflector. The semiconductor light-emitting device comprises a semiconductor stack 1 having a first surface 13 and a second surface 14 opposite to the first surface 13. The semiconductor stack 1 comprises a first semiconductor layer 11, a second semiconductor layer 12, and an active layer 10 between the first semiconductor layer 11 and the second semiconductor layer 12, wherein the first surface 13 is the surface of the first semiconductor layer 11 and the second surface 14 is the surface of the second semiconductor layer 12. The first semiconductor layer 11 and the second semiconductor layer 12 have different electrically conductive types, electrical properties, polarities or provide electric holes or electrons by being doped with different elements; the active layer 10 between the first semiconductor layer 11 and the second semiconductor layer 12 is capable of transforming electrical energy into light energy. The wavelength of the light from the active layer 10 can be adjusted by changing the physical and chemical composition of one or multiple layers of the semiconductor stack 1. The commonly used material for forming the semiconductor stack 1 comprises aluminum gallium indium phosphide (AlGaInP) series, aluminum gallium indium nitride (AlGaInN) or zinc oxide (ZnO) series. The active layer 10 can be a single heterostructure (SH), double heterostructure (DH), double-side double heterostructure (DDH), multi-quantum well (MWQ) structure. Specifically, the active layer 10 can be intrinsic, p-type, or n-type semiconductor. When the electrical current flows through the semiconductor stack 1, the active layer 10 is capable of emitting light. As the material of the active layer 10 is aluminum gallium indium phosphide (AlGaInP) series, the active layer 10 is capable of emitting red, orange, yellow or amber light; as the material of the active layer 10 is aluminum gallium indium nitride (AlGaInN), the active layer 10 is capable of emitting blue or green light. In the following embodiments, the material of the active layer 10 is aluminum gallium indium phosphide (AlGaInP) series.

The first surface 13 of the semiconductor stack 1 has multiple protrusion portions 131 and multiple concave portions 132 alternately arranged, and each of the multiple protrusion portions 131 comprises a plateau 1313 and at least one bevel 1312, wherein an inclined angle θ between 15 and 75 degrees is formed between the bevel 1312 and the bottom surface of the concave portion 132, and each of the multiple protrusion portions 131 has a height between 500 nm and 5000 nm relative to the concave portion 132. On each of the plateaus 1313, there is at least one contacting structure 2 arranged for ohmically contacting the first semiconductor layer 11. In the embodiment, the material of the contacting structure 2 comprises Ge, Be, Au, Ni, Pd, Zn or the alloy thereof.

A transparent conduction layer 3 conformally covers the first surface 13 and electrically contacts the contacting structure 2. The material of the transparent conduction layer 3 comprises ITO, InO, SnO, CTO, ATO, AZO, ZTO, ZnO, or GaP.

A first electrode 4 is formed on the first surface 13. The first electrode 4 comprises a first extending portion 41, a first bonding portion 43, and a first connecting portion 42. The first connecting portion 42 is formed on a first side 15 of the semiconductor stack 1 for connecting the first extending portion 41 and the first bonding portion 43, wherein the first extending portion 41 conformally covers and ohmically contacts the transparent conduction layer 3. Because the first extending portion 41 conformally covers the transparent conduction layer 3, the first extending portion 41 has a concave-convex surface 410. The first extending portion 41 is made of metal with high reflectivity for reflecting the light emitted from the active layer 10 to exit from the second surface 14, and meanwhile, the concave-convex surface 410 is able to concentrate the reflected light along the vertical direction H. A first insulating layer 61 is formed between the first extending portion 41 and the first bonding portion 43, covers the first extending portion 41, and extends to cover a second side 16 of the semiconductor stack 1. The first insulating layer 61 fills the concave-convex surface 411 of the first extending portion 41, wherein the concave-convex surface 411 is formed by the first extending portion 41 being conformal to the first surface 13. The material of the first bonding portion 43 and the first connecting portion 42 is different from the material of the first extending portion 41. The material of the first bonding portion 43 and the first connecting portion 42 comprises Ti, W, Pt, Ni, Sn, Au or the alloy thereof; the first extending portion 41 comprises metals with high reflectivity, such as Ag, Au, Al, Ni, Sn, Cu, Ti, Pt, stacks thereof or the alloy thereof; the material of first insulating layer 61 comprises organic material, such as Sub, BCB, PFOB, epoxy, acrylic resin, COC, PMMA, PET, PC, polyetherimide and Fluorocarbon Polymer, inorganic material, such as silicone and glass, or dielectric material, such as $Al_2O_3$, SiNx, $SiO_2$, $TiO_2$ and $MgF_2$.

Figure 1B:
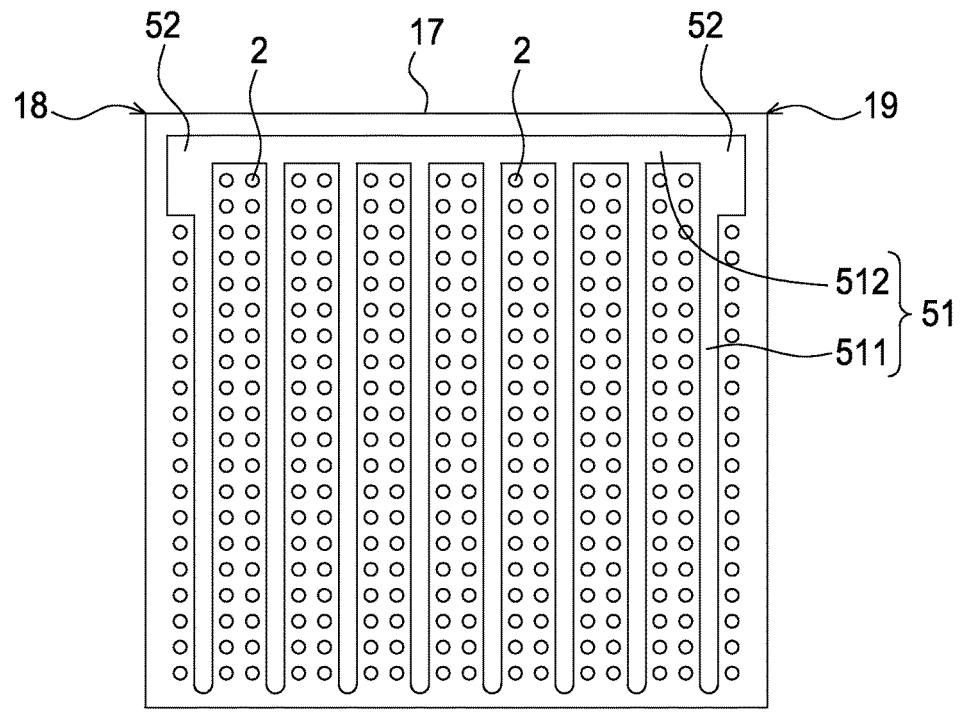
FIG. 1B shows a top view of the structure of the semiconductor light-emitting device I in accordance with the first embodiment.

A second electrode 5 comprises a second extending portion 51 on the second surface 14, a second bonding portion 53 on the first surface 13, and a second connecting portion 52 on the second side 16 of the semiconductor stack 1 for connecting the second extending portion 51 and the second bonding portion 53. The second surface 14 of the semiconductor stack 1 has multiple recesses 141, wherein the multiple recesses 141 are corresponding to the multiple concave portions 132 of the first surface 13 in the vertical direction H. The second extending portion 51 is disposed in the multiple recesses 141 to ohmically contact the second semiconductor layer 12, and the second bonding portion 53 is on the first surface 13 and isolated from the first extending portion 41 and the transparent conduction layer 3 by the first insulating layer 61. There is a gap 7 between the second bonding portion 53 and the first bonding portion 43 to separate second bonding portion 53 and the first bonding portion 43, wherein the width of the gap 7 is between 70 μm and 250 μm. As the shape of the semiconductor light-emitting device is a square with four 12 mil sides and the area of the semiconductor light-emitting device is 144 square mil, the total area of the first bonding portion 43 and the second bonding portion 53 is between 15%~80% of the area of the semiconductor light-emitting device, and, in other words, the area of the first bonding portion 43 and the second bonding portion 53 is between 21.6 and 115.2 square mil. As the shape of the semiconductor light-emitting device is a square with four 28 mil sides and the area of the semiconductor light-emitting device is 784 square mil, the total area of the first bonding portion 43 and the second bonding portion 53 is between 60%~92% of the area of the semiconductor light-emitting device, and, in other words, the total area of the first bonding portion 43 and the second bonding portion 53 is between 470.4 and 721.28 square mil. As the shape of the semiconductor light-emitting device is a square with four 40 mil sides and the area of the semiconductor light-emitting device is 1600 square mil, the total area of the first bonding portion 43 and the second bonding portion 53 is between 75%~95% of the area of the semiconductor light-emitting device, and, in other words, the total area of the first bonding portion 43 and the second bonding portion 53 is between 900 and 1520 square mil. The second connecting portion 52 is on the second side 16 of the semiconductor stack 1 and isolated from the second side 16 by the first insulating layer 61. As FIG. 1B shows a top view of the structure of the semiconductor light-emitting device I in accordance with the first embodiment, the second extending portion 51 comprises multiple first extending electrodes 511 which are parallel to each other and a second extending electrode 512. The second extending electrode 512 is perpendicular to the multiple first extending electrodes 511 and electrically connects with the second connecting portions 52 arranged in the corner 18 and the corner 19 of the semiconductor stack 1. The second extending electrode 512 is near and parallel to a side 17 of the semiconductor stack 1, and the second extending electrode 512 and the multiple first extending electrodes 511 do not overlap with all of the contacting structures 2 in the vertical direction H. The material of the second extending portion 51 comprises metal, such as Au, Ge, Be, Ni, Pd, Zn or the alloy thereof, or transparent oxide, such as ITO, InO, SnO, CTO, ATO, AZO, ZTO or ZnO; the material of the second bonding portion 53 and the second connecting portions 52 comprises Ti, W, Pt, Ni, Sn, Au or the alloy thereof.

An adhesive layer 9 covers the second surface 14, the second extending portion 51, and the second connecting portions 52. A substrate 8 is adhered to the second surface 14 by using the adhesive layer 9, and the light emitted from the active layer 10 is able to penetrate the substrate 8 and the adhesive layer 9. The material of the adhesive layer 9, which is transparent to the light emitted from the active layer 10, comprises organic material, such as Sub, BCB, PFOB, epoxy, acrylic resin, COC, PMMA, PET, PC, polyetherimide and Fluorocarbon Polymer, inorganic material, such as silicone and glass, or dielectric material, such as $Al_2O_3$, SiNx, $SiO_2$, $TiO_2$ and $MgF_2$. The material of the substrate 8, which is transparent to the light emitted from the active layer 10, comprises GaAs, GaP, GaN, sapphire, diamond, glass, quartz, acryl, ZnO or AN.

In another embodiment, a transparent conductive layer (not shown) can be arranged between the adhesive layer 9 and the second surface 14 and electrically connects with the second semiconductor layer 12 and the second extending portion 51 for improving electrical current spreading transversely so the area of the second extending portion 51 is reduced, or can even replace the second extending portion 51 to reduce the shading area of the second extending portion 51 and increase the light extracting efficiency. The material of the transparent conductive layer comprises ITO, InO, IZO, SnO, CTO, ATO, AZO, ZTO, ZnO, or GaP.

Second Embodiment

Figure 2:
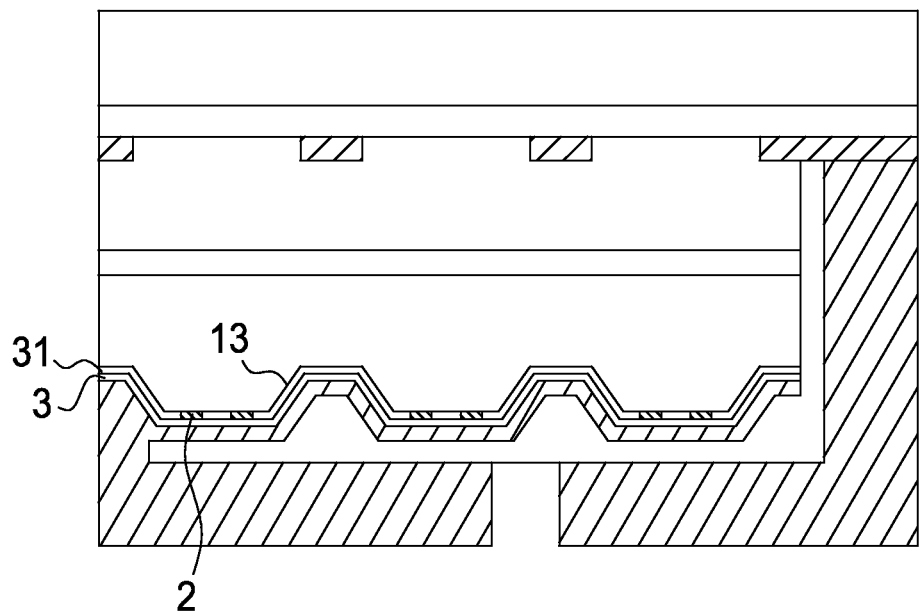
FIG. 2 shows a structure of a semiconductor light-emitting device II in accordance with the second embodiment of the application.

FIG. 2 shows a structure of a semiconductor light-emitting device II in accordance with the second embodiment of the application. The difference between the structure of the semiconductor light-emitting device II disclosed in the second embodiment and the structure of the semiconductor light-emitting device I disclosed in the first embodiment is that the structure of the semiconductor light-emitting device II has a transparent layer 31 between the transparent conduction layer 3 and the first surface 13. The transparent layer 31 conformally covers the first surface 13 and exposes the contacting structure 2 so the contacting structure 2 directly contacts with the transparent conduction layer 3. The refractive index of the transparent layer 31 is smaller than the refractive index of the transparent conduction layer 3, and, preferably, the refractive index of the transparent layer 31 is smaller than 1.5 so that the reflectivity to the light emitted from the active layer 10 can be increased. The material of the transparent layer 31 comprises transparent inorganic material, such as $SiO_x$, $SiN_x$ and $MgF_2$, or transparent organic material, such as silicone, epoxy, polyimide, or PFCB.

Third Embodiment

Figure 3:
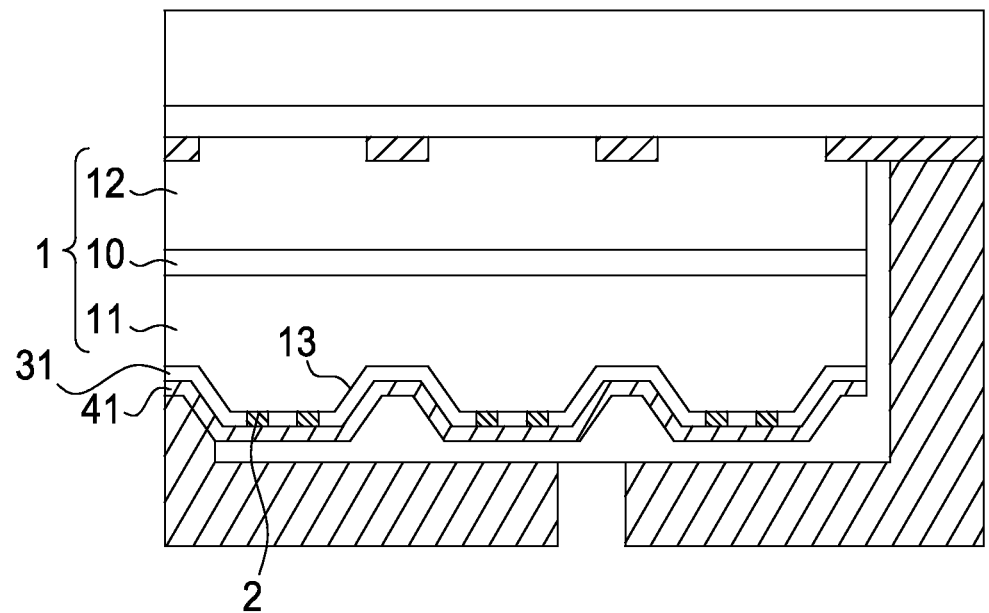
FIG. 3 shows a structure of a semiconductor light-emitting device III in accordance with the third embodiment of the application.

FIG. 3 shows a structure of a semiconductor light-emitting device III in accordance with the third embodiment of the application. The difference between the structure of the semiconductor light-emitting device III disclosed in the third embodiment and the structure of the semiconductor light-emitting device I disclosed in the first embodiment is that, in the semiconductor light-emitting device III, a transparent layer 31 contacts the first extending portion 41 and the first surface 13 and exposes the contacting structure 2 so that the contacting structure 2 directly connects with the first extending portion 41 and the electrical current flowing through the semiconductor stack 1 enters the first extending portion 41 via the contacting structure 2. The material of the transparent layer 31 as mentioned in the third embodiment comprises transparent inorganic material, such as SiOx, SiNx and $MgF_2$, or transparent organic material, such as silicone, epoxy, polyimide or PFCB.

Process Embodiment

Figure 4A:
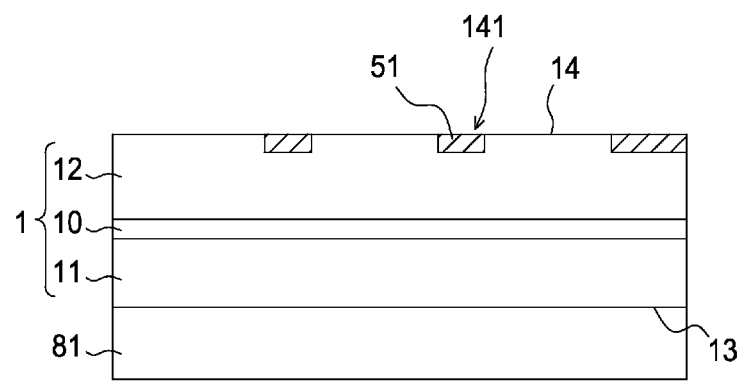
FIGS. 4A to 4D show the process flow of the semiconductor light-emitting device in accordance with a process embodiment of the application.

FIGS. 4A to 4D show the process flow of the semiconductor light-emitting device in accordance with process embodiment of the application. As FIG. 4A shows, a growth substrate 81 is provided, and a semiconductor stack 1, which is formed on the growth substrate 81, comprises a first semiconductor layer 11, an active layer 10, and a second semiconductor layer 12, wherein the material of the first semiconductor layer 11, the active layer 10, and the second semiconductor layer 12 is the same as the material mentioned in the first embodiment, and the material of the growth substrate 81 comprises sapphire, SiC, GaN, GaAs or GaP. Multiple recesses 141 are formed on a second surface 14 of the second semiconductor layer 12 by lithography etching method which comprises dry etch and wet etch, wherein the multiple recesses 141 on the second surface 14 are connected. The next step is to form a second extending portion 51 in the multiple recesses 141 by evaporation, wherein the material of the second extending portion 51 comprises Au, Ge, Be, Ni, Pd, Zn or the alloy thereof.

Figure 4B:
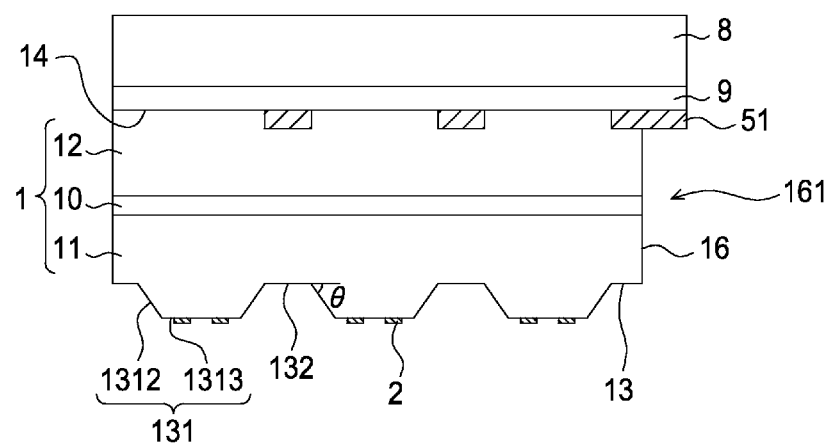

As FIG. 4B shows, a substrate 8 is provided to be adhered to the second surface 14 with an adhesive layer 9 by the use of bonding method, such as alignment bonding method. The adhesive layer 9 is aligned with the second surface 14 firstly, and then the adhesive layer 9 is adhered to the second surface 14 by heating and pressing. The next step is to detach the growth substrate 81 from the semiconductor stack 1 and expose the first surface 13 of the semiconductor stack 1. The method of detaching the growth substrate 81 comprises light irradiation method, such as laser lift-off, which utilizes laser to penetrate the growth substrate 81 and light the interface between the growth substrate 81 and the semiconductor stack 1, and then the growth substrate 81 and the semiconductor stack 1 are separated. The method of detaching the growth substrate 81 also comprises directly removing the growth substrate 81 by wet etching or removing the interface layer (not shown) between the semiconductor stack 1 and the growth substrate 81. Besides, the interface layer (not shown) between the semiconductor stack 1 and the growth substrate 81 can also be directly removed by using vapor to etch in high temperature to separate the growth substrate 81 and the semiconductor stack 1.

Next, a portion of the second side 16 of the semiconductor stack 1 is removed by wet etching or dry etching to form a vacancy 161 and expose a portion of the second extending portion 51, and the first surface 13 is lithographically etched such that the first surface 13 has multiple protrusion portions 131 and multiple concave portions 132 alternately arranged, wherein each protrusion portion 131 comprises a plateau 1313 and at least one bevel 1312, and an inclined angle θ between 15 and 75 degrees is formed between the bevel 1312 and the bottom surface of the concave portion 132. Then at least one contacting structure 2 arranged on the each protrusion portion 131 for ohmically contacting the first semiconductor layer 11. In the embodiment, the material of the contacting structure 2 comprises Ge, Be, Au, Ni, Pd, Zn or the alloy thereof.

Figure 4C:
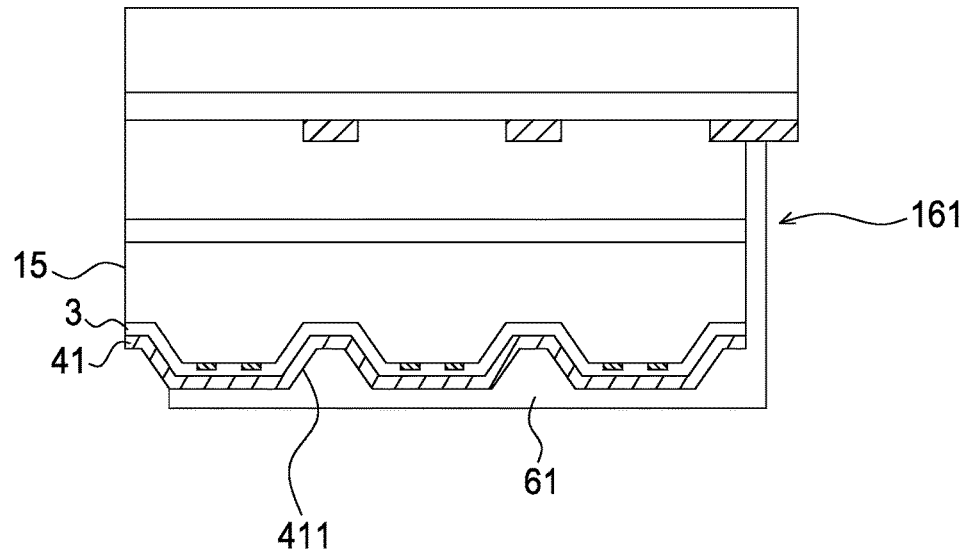

As FIG. 4C shows, a transparent conduction layer 3 and a first extending portion 41 are sequentially and conformally formed on the first surface 13, wherein the transparent conduction layer 3 comprises ITO, InO, SnO, CTO, ATO, AZO, ZTO, ZnO or GaP, and the first extending portion 41 comprises metal with high reflectivity, such as Ag, Au, Al, Ni, Sn, Cu, Ti, Pt and the alloy thereof. Then a first insulating layer 61 is formed on the first extending portion 41 to cover the first extending portion 41 and the second side 16 of the semiconductor stack 1 and expose a portion of the first extending portion 41 above the first side of the semiconductor stack 1, wherein the first insulating layer 61 fills a concave-convex surface 411 of the first extending portion 41 while the concave-convex surface 411 is formed by the first extending portion 41 being conformal to the first surface 13.

Figure 4D:
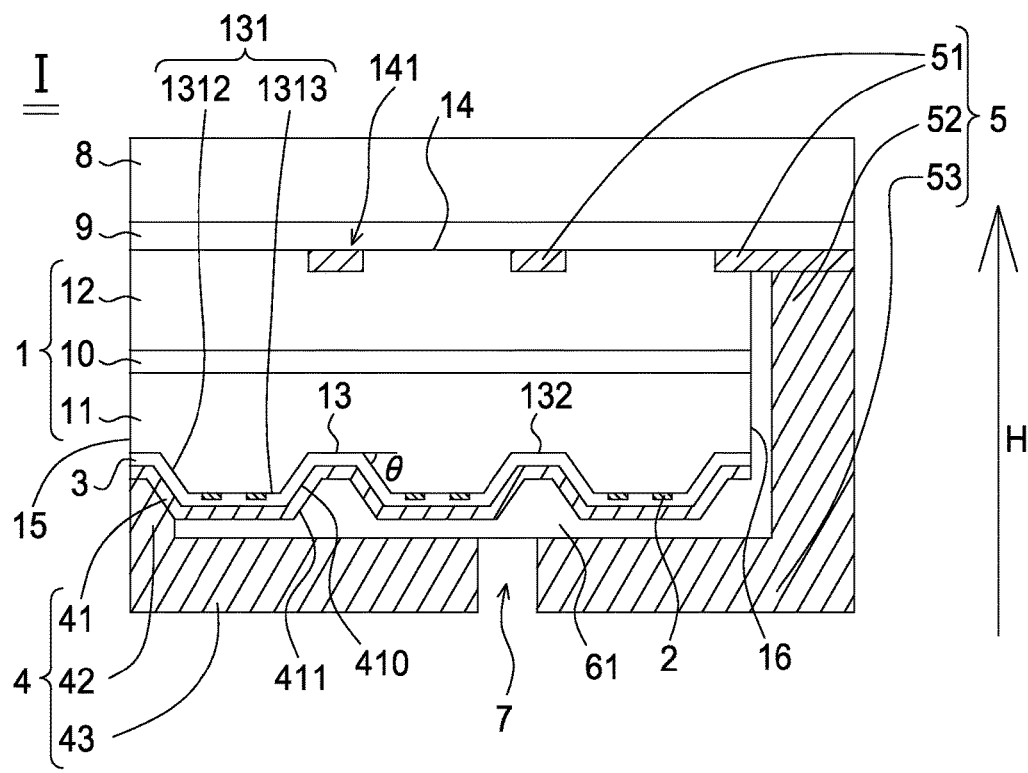
Figure 5:
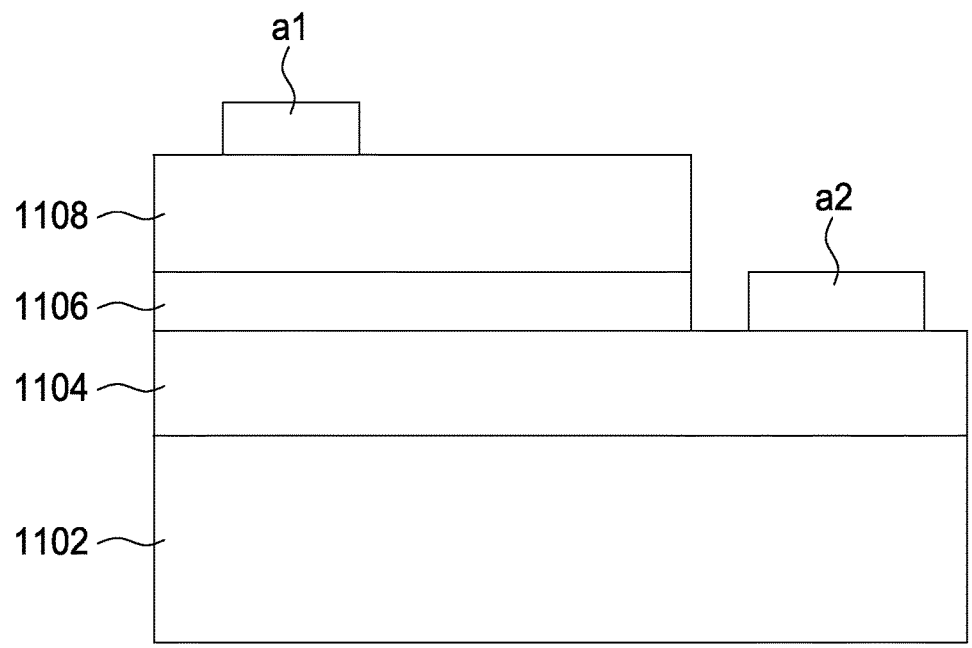
FIG. 5 shows a cross-sectional view of a conventional LED structure.
Figure 6:
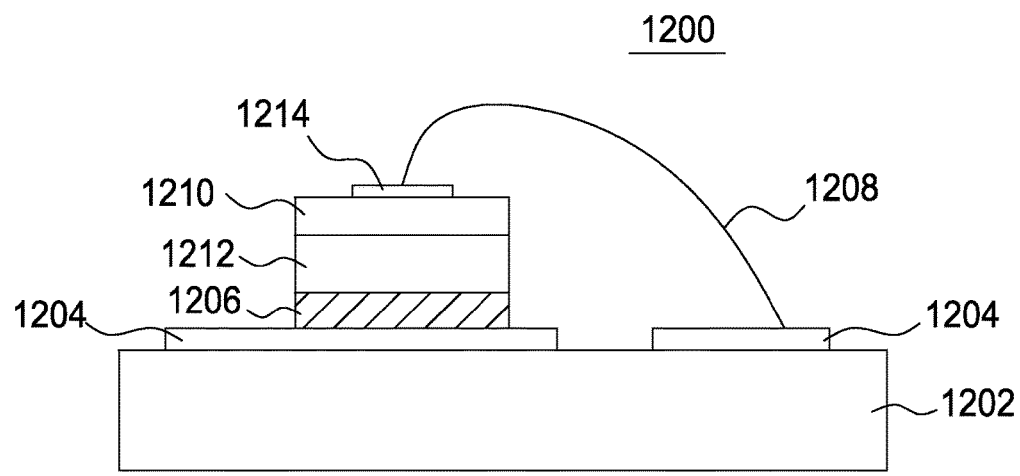
FIG. 6 shows a structure of a conventional light-emitting apparatus.

Then, as FIG. 4D shows, the next step is forming a first connecting portion 42, a first bonding portion 43, a second connecting portion 52 and a second bonding portion 53, wherein the second connecting portion 52 and the second bonding portion 53 are formed on the first insulating layer 61, the first connecting portion 42 is formed on the first side 15 of the semiconductor stack 1 for connecting the first extending portion 41 and the first bonding portion 43, and the second connecting portion 52 is formed on the vacancy 161 for connecting with the second bonding portion 53 and the exposed portion of the second extending portion 51. The material of the first connecting portion 42, the first bonding portion 43, the second connecting portion 52, and the second bonding portion 53 comprises Ti, W, Pt, Ni, Sn, Au or the alloy thereof.

Fourth Embodiment

Figure 8A:
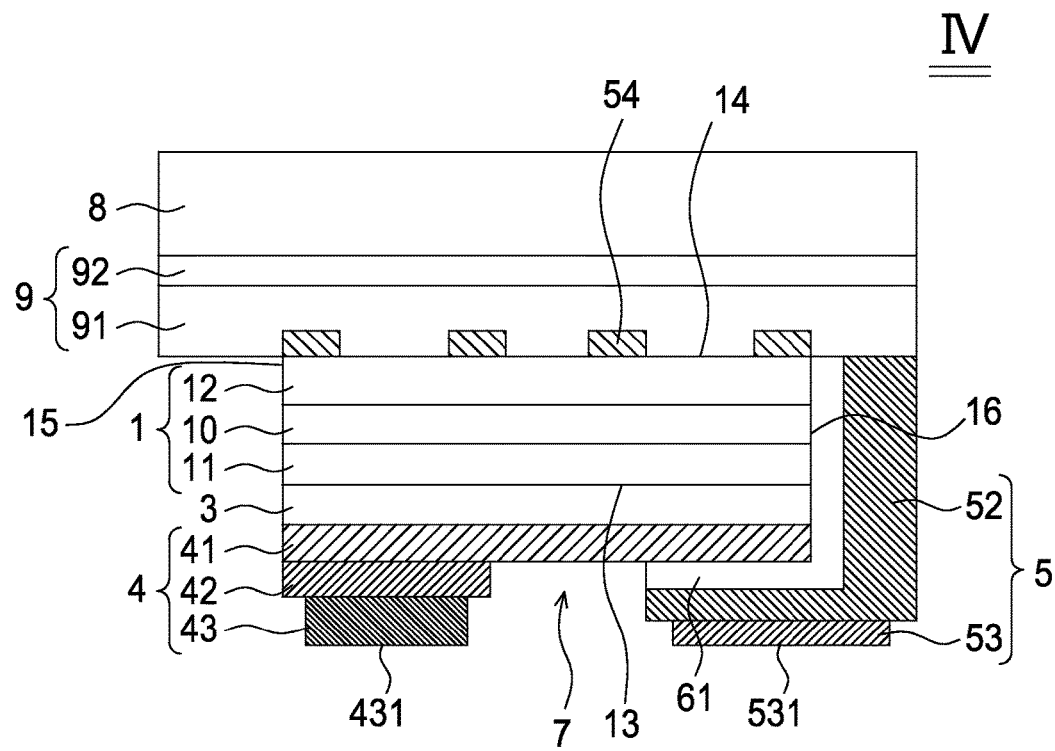
FIG. 8A shows a structure of a semiconductor light-emitting device IV in accordance with the fourth embodiment of the application

FIG. 8A shows a structure of a semiconductor light-emitting device IV in accordance with the fourth embodiment of the application. The semiconductor light-emitting device disclosed by the embodiment is a flip-chip type of light-emitting diode device with a reflector. The semiconductor light-emitting device comprises a semiconductor stack 1 having a first surface 13 and a second surface 14 opposite to the first surface 13. The semiconductor stack 1 comprises a first semiconductor layer 11, a second semiconductor layer 12, and an active layer 10 between the first semiconductor layer 11 and the second semiconductor layer 12, wherein the first surface 13 is the surface of the first semiconductor layer 11 and the second surface 14 is the surface of the second semiconductor layer 12. The first semiconductor layer 11 and the second semiconductor layer 12 have different electrically conductive types, electrical properties, polarities or provide electric holes or electrons by being doped with different elements; the active layer 10 between the first semiconductor layer 11 and the second semiconductor layer 12 is capable of transforming electrical energy into light energy. The wavelength of the light from the active layer 10 can be adjusted by changing the physical and chemical composition of one or multiple layers of the semiconductor stack 1. The commonly used material for forming the semiconductor stack 1 comprises aluminum gallium indium phosphide (AlGaInP) series, aluminum gallium indium nitride (AlGaInN) or zinc oxide (ZnO) series. The active layer 10 can be a single heterostructure (SH), double heterostructure (DH), double-side double heterostructure (DDH), multi-quantum well (MWQ) structure. Specifically, the active layer 10 can be intrinsic, p-type or n-type semiconductor. When the electrical current flows through the semiconductor stack 1, the active layer 10 is capable of emitting light. As the material of the active layer 10 is aluminum gallium indium phosphide (AlGaInP) series, the active layer 10 is capable of emitting red, orange, yellow or amber light; as the material of the active layer 10 is aluminum gallium indium nitride (AlGaInN), the active layer 10 is capable of emitting blue or green light. In the following embodiment, the material of the active layer 10 is aluminum gallium indium phosphide (AlGaInP) series.

A transparent conduction layer 3 is on the first surface 13 of the first semiconductor layer 11 to cover the first surface 13. The material of the transparent conduction layer 3 comprises ITO, InO, SnO, CTO, ATO, AZO, ZTO, ZnO, or GaP.

A first electrode 4 is formed on the first surface 13. The first electrode 4 comprises a first extending portion 41, a first bonding portion 43, and a first connecting portion 42. The first connecting portion 42 is on a first side 15 of the semiconductor stack 1 for connecting the first extending portion 41 and the first bonding portion 43, wherein the first extending portion 41 conformally covers and ohmically contacts the transparent conduction layer 3. The first extending portion 41 is made of metal with high reflectivity for reflecting the light emitted from the active layer 10 to exit from the second surface 14 of the second semiconductor layer 12. A first insulating layer 61 is on the first extending portion 41 to cover a portion of the first extending portion 41 and extend to cover the second side 16 of the semiconductor stack 1. The first connecting portion 42 is on a portion of the first extending portion 41 which is uncovered by the first insulating layer 61 and directly contacts the first extending portion 41. The first bonding portion 43 is on the first connecting portion 42. In the embodiment, the area of the first bonding portion 43 is smaller than the area of the first connecting portion 42, and the material of the first bonding portion 43 is different from the material of the first connecting portion 42. The material of the first bonding portion 43 and the first connecting portion 42 comprises Ti, W, Pt, Ni, Sn, Au or the alloy thereof; the first extending portion 41 comprises metal with high reflectivity, such as Ag, Au, Al, Ni, Sn, Cu, Ti, Pt, stacks thereof or the alloy thereof; the material of first insulating layer 61 comprises organic material, such as Sub, BCB, PFOB, epoxy, acrylic resin, COC, PMMA, PET, PC, polyetherimide and Fluorocarbon Polymer; inorganic material, such as silicone and glass; dielectric material, such as $Al_2O_3$, $SiN_x$, $SiO_2$, $TiO_2$, and $MgF_2$. Multiple contacting structures 54 are on the second surface 14 of the semiconductor stack 1 and ohmically contact the second semiconductor layer 12. An adhesive layer 9 is on the second surface 14 and covers all of the multiple contacting structures 54. The adhesive layer 9 comprises a first adhesive layer 91 and a second adhesive layer 92, wherein the first adhesive layer 91 directly contacts the multiple contacting structures 54 and the second surface 14 and protrudes from the first side 15 or the second side 16 of the semiconductor stack 1. The second adhesive layer 92 is arranged on the first adhesive layer 91 and adheres to the first adhesive layer 91. The material of the multiple contacting structures 54 comprises Au, Ge, Be, Ni, Pd, Zn or the alloy thereof. The first adhesive layer 91 is made of transparent and electrically conductive material which comprises ITO, InO, IZO, SnO, CTO, ATO, AZO, ZTO, ZnO, or GaP. The second adhesive layer 92 is made of the material which has good adhesion and transparent to the light emitted from the active layer 10, wherein the material of the second adhesive layer 92 comprises organic material, such as Sub, BCB, PFOB, epoxy, acrylic resin, COC, PMMA, PET, PC, polyetherimide and Fluorocarbon Polymer; or inorganic material, such as silicone.

A second electrode 5 comprises a second connecting portion 52 and a second bonding portion 53. The second connecting portion 52 on the first insulating layer 61 covers a portion of the first surface 13, extends to cover the second side 16 and directly contacts the first adhesive layer 91, wherein the first insulating layer 61 is able to prevent the second connecting portion 52 from directly contacting the first extending portion 41, the transparent conduction layer 3 and the semiconductor stack 1. The second bonding portion 53 is arranged on the first surface 13 and directly contacts the second connecting portion 52. The material of the second connecting portion 52 and the second bonding portion 53 comprises Ti, W, Pt, Ni, Sn, Au or the alloy thereof. The first bonding portion 43 and the second bonding portion 53 are used for importing the electrical current to make the active layer 10 emitting a light. As the first semiconductor layer 11 is a p-type semiconductor and the second semiconductor layer 12 is an n-type semiconductor, the electrical current enters the first bonding portion 43, then is conducted and distributed by the first connecting portion 42, the first extending portion 41, and the transparent conduction layer 3, and uniformly enters the semiconductor stack 1. And then, the electrical current is conducted by the multiple contacting structures 54 and the first adhesive layer 91 to the second connecting portion 52 and the second bonding portion 53, and finally exits from the second bonding portion 53.

In another embodiment, the surface 531 of the second bonding portion 53 and the surface 431 of the first bonding portion 43 are on the same horizontal plane. There is a gap 7 between the second bonding portion 53 and the first bonding portion 43 to separate second bonding portion 53 and the first bonding portion 43, wherein the width of the gap 7 is between 70 µm and 250 µm. As the shape of the semiconductor light-emitting device is a square with four 12 mil sides and the area of the semiconductor light-emitting device is 144 square mil, the total area of the first bonding portion 43 and the second bonding portion 53 is between 15%~80% of the area of the semiconductor light-emitting device, and, in other words, the total area of the first bonding portion 43 and the second bonding portion 53 is between 21.6 and 115.2 square mil. As the shape of the semiconductor light-emitting device is a square with four 28 mil sides and the area of the semiconductor light-emitting device is 784 square mil, the total area of the first bonding portion 43 and the second bonding portion 53 is between 60%~92% of the area of the semiconductor light-emitting device, and, in other words, the total area of the first bonding portion 43 and the second bonding portion 53 is between 470.4 and 721.28 square mil. As the shape of the semiconductor light-emitting device is a square with four 40 mil sides and the area of the semiconductor light-emitting device is 1600 square mil, the total area of the first bonding portion 43 and the second bonding portion 53 is between 75%~95% of the area of the semiconductor light-emitting device, and, in other words, the total area of the first bonding portion 43 and the second bonding portion 53 is between 900 and 1520 square mil.

A substrate 8 is adhered to the second surface 14 by using the adhesive layer 9, and the light emitted from the active layer 10 is able to penetrate the substrate 8 and the adhesive layer 9. The material of the substrate 8, which is transparent to the light emitted from the active layer 10, comprises GaAs, GaP, GaN, sapphire, diamond, glass, quartz, acryl, ZnO or AN. In the embodiment, the first adhesive layer 91 is IZO (the refractive index is about 2.1), the second adhesive layer 92 is BCB (the refractive index is about 1.5), and the substrate 8 is glass (the refractive index is smaller than 1.5). As the light emitted from the active layer 10 sequentially passes through the first adhesive layer 91, the second adhesive layer 92, and the substrate 8, since the refractive indices decreases sequentially, the chance of total internal reflection can be reduced.

Figure 8B:
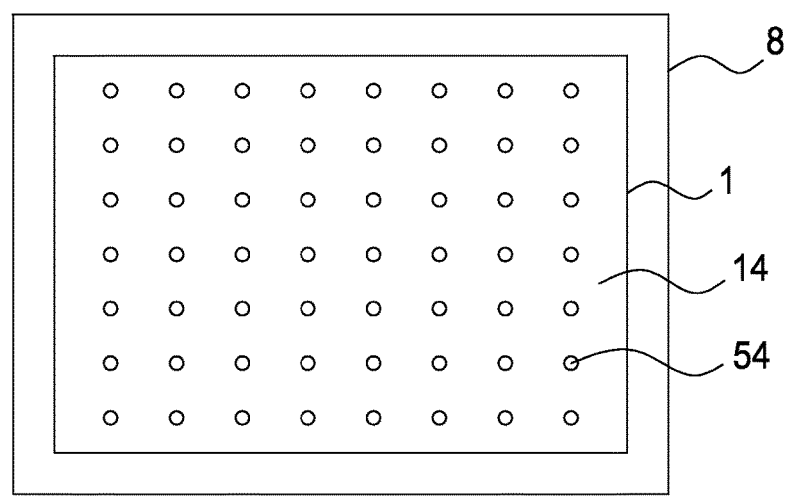
FIG. 8B shows the top-view of the structure of the semiconductor light-emitting device IV in accordance with the fourth embodiment of the application.

FIG. 8B shows the top-view of the structure of the semiconductor light-emitting device IV in accordance with the fourth embodiment of the application. The width of the semiconductor stack 1 is smaller than the width of the substrate 8, and the multiple contacting structures 54 are arranged on the second surface 14 of the semiconductor stack 1 as an array, wherein the multiple contacting structures 54 are independent and do not contact to each other.

Figure 7:
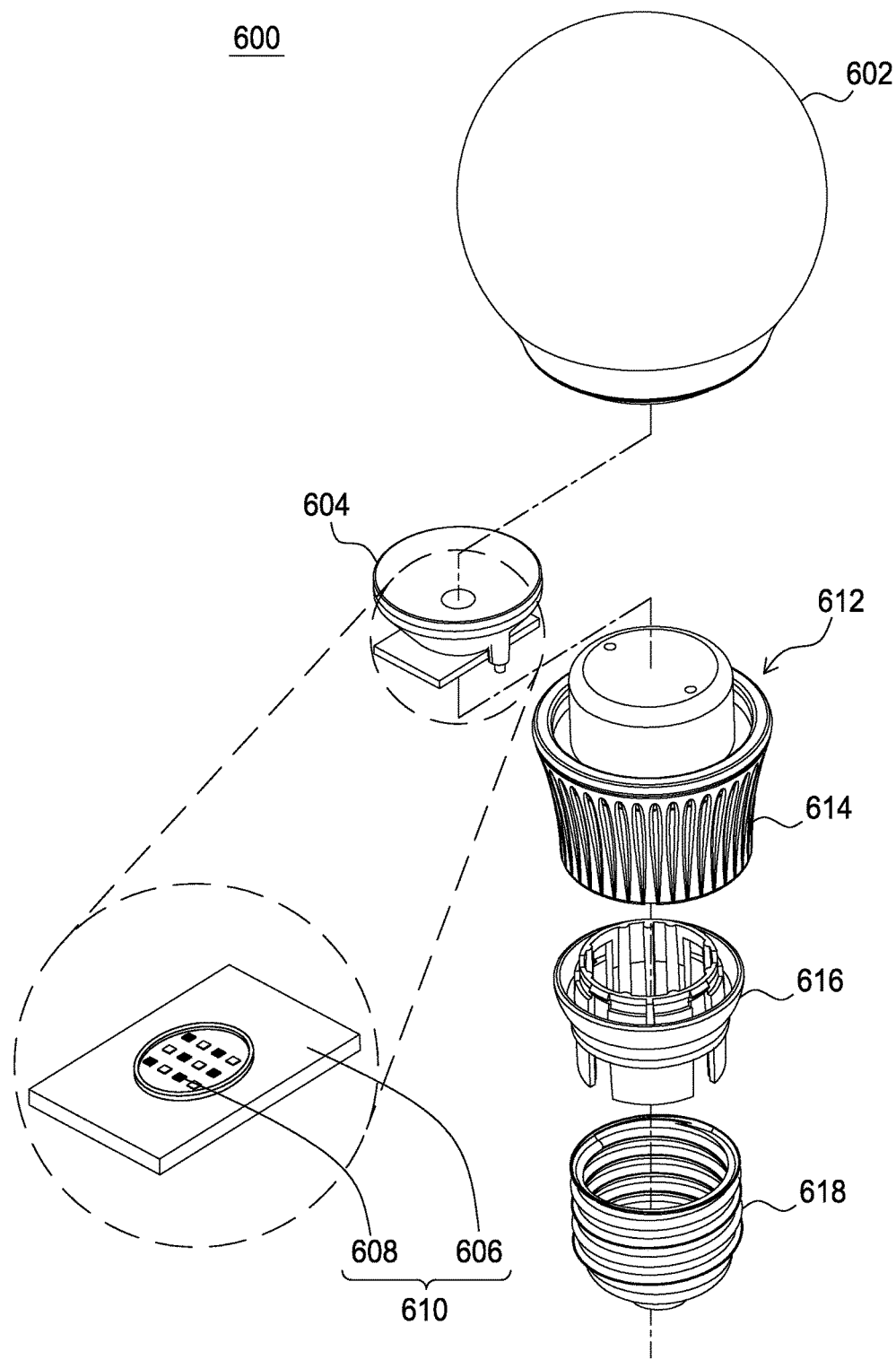
FIG. 7 shows a structure in accordance with another embodiment of the application.

FIG. 7 shows a structure in accordance with another embodiment of the application. A light bulb 600 comprises a lampshade 602, a lens 604, a light module 610, a holder 612, a heat sink 614, a connector 616 and an electrical connecting unit 618. The light module 610 comprises a carrier 606 and a plurality of above-mentioned semiconductor light-emitting devices 608 on the carrier 606.

Although the present application has been explained above, it is not the limitation of the range, the sequence in practice, the material in practice, or the method in practice. Any modification or decoration for present application is not detached from the spirit and the range of such.

What is claimed is:

1. A semiconductor light-emitting device, comprising:
    a semiconductor stack for emitting a light and having a first surface and a second surface opposite to the first surface, wherein the first surface comprises multiple protrusion portions and multiple concave portions;
    a first electrode on the first surface and electrically connecting with the semiconductor stack;
    a second electrode on the first surface and electrically connecting with the semiconductor stack;
    a transparent layer conformally covering the first surface and between the first electrode and the semiconductor stack; and
    a transparent substrate on the second surface;
    wherein the light penetrates the transparent substrate,
    wherein the first electrode comprises a first bonding portion and a first extending portion, and the first extending portion is between the first bonding portion and the transparent layer and conformally covers the transparent layer, and
    wherein the protrusion portion is between 500 nm and 5000 nm in height.

2. The semiconductor light-emitting device according to claim 1, further comprising an insulating layer covering the first extending portion and a first side of the semiconductor stack, and being between the first extending portion and the first bonding portion.

3. The semiconductor light-emitting device according to claim 2, wherein the first electrode further comprises a first connecting portion passing through the insulating layer and electrically connecting the first bonding portion and the first extending portion.

4. The semiconductor light-emitting device according to claim 3, wherein the first connecting portion is on the second side of the semiconductor stack opposite to the first side.

5. The semiconductor light-emitting device according to claim 3, wherein the first bonding portion and the first connecting portion comprise a first material, the first extending portion comprises a second material, the first material comprises Ti, Pt, Ni, Sn, Au or the alloy thereof, and the second material comprises Ag, Au, Al, Ni, Sn, Cu, Ti, Pt or the alloy thereof.

6. The semiconductor light-emitting device according to claim 1, wherein the protrusion portion comprises a plateau and a bevel, the concave portion comprises a bottom surface, and an angle between the bevel and the bottom surface is between 15 and 75 degrees.

7. The semiconductor light-emitting device according to claim 1, wherein the second electrode comprises a second bonding portion and a second extending portion, wherein the second bonding portion is on the first surface and the second extending portion is on the second surface.

8. The semiconductor light-emitting device according to claim 7, wherein the second bonding portion and the first bonding portion have the same area.

9. The semiconductor light-emitting device according to claim 7, wherein the total area of the first bonding portion and the second bonding portion is between 15% and 95% of the area of the semiconductor light-emitting device.

10. The semiconductor light-emitting device according to claim 7, further comprising an insulating layer between the semiconductor stack and the second bonding portion.

11. The semiconductor light-emitting device according to claim 10, wherein the second electrode further comprises a second connecting portion electrically connecting the second bonding portion and the second extending portion, and the second electrode is on a first side of the semiconductor stack, wherein the insulating layer is between the second connecting portion and the semiconductor stack.

12. The semiconductor light-emitting device according to claim 11, wherein the second extending portion comprises Au, Be, Ge, Ni, Pd, Zn, or the alloy thereof.

13. The semiconductor light-emitting device according to claim 11, wherein the second extending portion comprises ITO, InO, SnO, CTO, ATO, AZO, ZTO, or ZnO.

14. The semiconductor light-emitting device according to claim 11, wherein the second bonding portion and the second connecting portion comprises a fourth material, and the fourth material comprises Ti, W, Pt, Ni, Sn, Au or the alloy thereof.

15. The semiconductor light-emitting device according to claim 7, wherein the second extending portion comprises multiple extending electrodes which are parallel to each other corresponding to the multiple concave portions, and the multiple protrusion portions do not overlap with the multiple extending electrodes in the direction perpendicular to the stacking direction.

16. The semiconductor light-emitting device according to claim 15, wherein the second surface comprises multiple concaves and the multiple extending electrodes are in the multiple concaves respectively.

17. A semiconductor light-emitting device, comprising:
a semiconductor stack for emitting a light and having a first surface and a second surface opposite to the first surface, wherein the first surface comprises multiple protrusion portions and multiple concave portions;
a first electrode on the first surface and electrically connecting with the semiconductor stack;
a second electrode on the first surface and electrically connecting with the semiconductor stack;
a transparent layer conformally covering the first surface and between the first electrode and the semiconductor stack;
a transparent substrate on the second surface; and
multiple contacting structures on the multiple protrusion portions and ohmically contacting the semiconductor stack and the first electrode,
wherein the multiple contacting structures comprise Au, Be, Ge, Ni, Pd, Zn or the alloy thereof,
wherein the light penetrates the transparent substrate, and
wherein the first electrode comprises a first bonding portion and a first extending portion, and the first extending portion is between the first bonding portion and the transparent layer and conformally covers the transparent layer.

18. The semiconductor light-emitting device according to claim 17, wherein the protrusion portion comprises a plateau and a bevel, the concave portion comprises a bottom surface, and an angle between the bevel and the bottom surface is between 15 and 75 degrees.

19. The semiconductor light-emitting device according to claim 17, further comprising an insulating layer covering the first extending portion and a first side of the semiconductor stack, and being between the first extending portion and the first bonding portion.

20. The semiconductor light-emitting device according to claim 19, wherein the first electrode further comprises a first connecting portion passing through the insulating layer and electrically connecting the first bonding portion and the first extending portion.

* * * * *